US 6,697,297 B2

(12) United States Patent
Keeth et al.

(10) Patent No.: US 6,697,297 B2
(45) Date of Patent: Feb. 24, 2004

(54) APPARATUS FOR SETTING WRITE LATENCY

(75) Inventors: Brent Keeth, Boise, ID (US); Brian Johnson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/230,673

(22) Filed: Aug. 29, 2002

(65) Prior Publication Data

US 2002/0196699 A1 Dec. 26, 2002

Related U.S. Application Data

(60) Continuation of application No. 09/745,608, filed on Dec. 20, 2000, now Pat. No. 6,445,643, which is a division of application No. 09/500,623, filed on Feb. 9, 2000, now Pat. No. 6,272,070.

(51) Int. Cl.[7] .............................. G11C 8/00; G11C 7/00
(52) U.S. Cl. .................. 365/233; 365/194; 365/189.04
(58) Field of Search .................... 365/233, 194, 365/189.04, 189.07

(56) References Cited

U.S. PATENT DOCUMENTS

| 5,813,023 | A | 9/1998 | McLaury |
| 5,890,195 | A | 3/1999 | Rao |
| 5,903,916 | A | 5/1999 | Pawlowski et al. |
| 5,910,920 | A | 6/1999 | Keeth |
| 5,917,760 | A | 6/1999 | Millar |
| 5,922,076 | A | 7/1999 | Garde |
| 5,933,155 | A | 8/1999 | Akeley |
| 5,933,623 | A | 8/1999 | Umemura et al. |
| 5,966,343 | A | 10/1999 | Thurston |
| 6,088,774 | A | 7/2000 | Gillingham |
| 6,212,127 | B1 | 4/2001 | Funaba et al. |
| 6,426,909 | B1 * | 7/2002 | Tomita ........................ 365/222 |
| 6,445,643 | B2 * | 9/2002 | Keeth et al. ................. 365/233 |

* cited by examiner

Primary Examiner—Thong Le
(74) Attorney, Agent, or Firm—TraskBritt

(57) ABSTRACT

A system and memory including a circuit for setting write latency and a write/valid indicator. Time margin regions are established just after the first or leading edge and just before the second or following edge of the preamble of the clock signal such that a latency setting will be found unacceptable if it causes a write enable signal to transition in either of these regions. A write/valid indicator circuit creates the start and end time margin regions by delaying either the clock signal or the write enable signal and comparing their timing with the timing of the undelayed write enable signal or clock signal respectively.

11 Claims, 9 Drawing Sheets

APPARATUS FOR SETTING WRITE LATENCY

CROSS-REFERENCE TO RELATED APPLICATIONS

This application is a continuation of application Ser. No. 09/745,608, filed Dec. 20, 2000, now U.S. Pat. No. 6,445,643 B2, issued Sep. 3, 2002, which is a divisional of application Ser. No. 09/500,623, filed Feb. 9, 2000, issued Aug. 7, 2001 as U.S. Pat. No. 6,272,070 B1.

BACKGROUND OF THE INVENTION

1. Field of the Invention

The present invention relates generally to a method and apparatus for setting write latency in a memory system. More particularly, the present invention relates to a write latency procedure and apparatus which reduce the risk of data stored in memory being defective due to the memory improperly receiving a write enable (RxEn) signal too early or too late in relation to the data and the preamble of the data clock to compensate for timing variations occurring after initialization.

2. State of the Art

Many integrated circuits and electronic devices use memory systems for storing data. Over time, the need for smaller and faster circuits and devices has reduced the tolerance for error, particularly in data transfer systems. Errors in a data storage system slow the system by requiring additional data transfer or causing the system to use unreliable or incorrect data.

The data transmission rate of modern integrated circuits is primarily limited by internal circuitry operating speeds. That is, communication networks have been developed which can transmit signals between circuitry at a rate that is faster than the capacity of many integrated circuits. To address the need for faster circuits, a group of integrated circuits can be on a common bus. In this configuration, each integrated circuit operates in a coordinated manner with the other integrated circuits to share data which is transmitted at a high speed. An example of such a high-speed data system is described in U.S. Pat. No. 5,917,760 to Millar (Jun. 29, 1999), incorporated herein by reference. Millar describes a high-speed data system using a common bus and a memory subsystem commonly known as SyncLink dynamic random access memory ("SLDRAM"). By providing an appropriate number of memory devices and an efficient control system as used in SLDRAM, very high-speed data transmission can be achieved.

In computer memory systems, particularly in what is often termed the main memory, information is typically stored in dynamic random access memory ("DRAM") integrated circuits. A memory controller manages the operations of the DRAMs. Some of the operations which are managed by the memory controller for DRAMs are read and write operations. A read operation of a memory controller typically includes the following steps: 1) initiating, via the memory controller, the read operation; 2) generating the row address strobe/column address strobe (RAS/CAS) memory timing signals and applying them, to the memory bank targeted by the read operation; 3) once the read data is available on the bank's memory data bus, buffering the read data into a buffer coupled to the memory bank; and 4) transferring the data from the memory buffer into a data path buffer for storage until the data is placed onto the processor bus for transmission to the processor or device requesting the data. In synchronous read operations such as those performed in SLDRAM, an output of data on the data bus results from a read command and an address received at a preceding leading edge of the clock. The delay in the number of clock cycles between the arrival of the read command at the input to the control logic and the availability of data at the data bus is the "latency" of the DRAM. In other words, the memory controller sends a read command to the DRAM based upon the latency setting which is programmed into the DRAM as part of an initialization process. The DRAM accesses its own stored data and returns the requested data at the appropriate time.

Distinct from a read operation, in a write operation the data is not yet stored in the DRAM. Therefore, upon receiving a write command, the DRAM must know ahead of time when the data will arrive in relation to the write command so that it can begin write operations at the correct time. The delay in clock cycles from the arrival of the write command to the beginning of the data is the write latency. A clock "tick" is one-half of a clock cycle, meaning that a clock cycle is the duration between the beginning of a clock cycle to the beginning of the next full clock cycle and a clock tick is only the duration between a falling and a rising (or a rising and a falling) edge of the clock signal. Because the DRAM is dependent upon surrounding systems for supplying both the write command and the data to be written, the latency setting is crucial to obtaining accurate data storage. In response to the write command, the DRAM generates a write enable (RxEn) signal based upon the latency setting. If the internally generated write enable (RxEn) signal fires too far ahead of the data to be written or too close to the data, data may be missed, or incorrect data may be stored. In either case, poor latency settings create reliability and efficiency problems. A write operation typically includes the following steps: 1) transferring the write data from the data path in the memory subsystem to a specified memory device; 2) initiating, via the memory controller, the write operation; and 3) internally generating the necessary memory timing signals and applying them to complete the write operation.

Latency settings in a memory system are established during initialization wherein the data transfer and data receive rates and timing are evaluated so that the subsystems can interfunction with other subsystems by reference to a common clock rate. The latency settings remain unchanged by the system until another initialization process is performed. During initialization of a memory system, the latency for DRAM is set to optimize system performance and to match up the DRAM latency to that expected by the memory controller. After latency settings are chosen during initialization of a system, the system typically changes to a normal operating mode wherein the read and write functions of the memory can be carried out.

In SLDRAM memory systems, there are primarily two methods used for establishing write latency. The first method involves performing a series of sequential writes to and reads from memory address locations while varying the write latency in the SLDRAM or the memory controller for each sequential write. The read and write data are then compared to determine which write latency settings for the SLDRAM match a write latency setting for the memory controller, resulting in valid data. When all of the address locations are read back, good data indicates a match between the DRAM write latency and that of the memory controller. The second method involves a long succession of back-to-back writes to varied address locations performed in a walking pattern. For each new write, the memory controller presents the data and data clock signal ("DCLK") to the data bus one tick later than the previous write. This allows the write data to "walk" through the point at which the DRAM enables its input buffers. Whenever the data and DCLK signals correctly align with the receiver enable signal, the write operation will capture and store the data correctly. The data at each memory address is then read back starting at the first write address. By analyzing the data pattern at each memory address, the amount of offset between the SLDRAM's and the memory controller's write latencies can be determined and set appropriately.

With reference to FIG. 1, in either of the above two methods, a valid write latency setting is indicated when the write enable (RxEn) signal 2, also called the receiver enable signal, transitions at the SLDRAM receiver 4, shown in FIG. 2, during the low preamble 6 of the DCLK signal 8. The preamble period is typically either two or three ticks in duration. FIG. 1 shows a three-tick preamble 6, meaning the DCLK signal 8 is low for a duration of three clock ticks. Two-tick preambles are also common. If the RxEn signal 2 transitions within the preamble 6, the SLDRAM will be able to accurately receive and store the data within the oscillation portion 10 of the DCLK signal 8. However, if the RxEn signal 2 transitions before or after the preamble period, the DRAM will capture data incorrectly and store defective information. So long as the RxEn signal 2 transitions within the preamble 6 of the DCLK signal 8, the latency is considered acceptable. Thus, there are often several latency settings which meet this criteria and are acceptable.

One problem that occurs using write latency settings established in this way is that as the system warms up, its characteristics change, including the speeds at which it transfers data between points. This often results in latency settings set at initialization which become insufficient because the write enable (RxEn) signal no longer fires within the preamble. This results in slower memory performance and more frequent data errors. Furthermore, in using latency settings established as described above, without specifically checking whether the stored data is correct by comparing it with the sent data, a system cannot know whether the data upon which it is relying from the memory subsystem is accurate. However, running frequent initialization processes to reset latency, or checking the accuracy of every data signal, would eliminate the benefits of high-speed data transfer and temporary data storage systems. It is, therefore, desirable in the art to have a system which can more reliably store data in a way which is unaffected by system and environmental variations after initialization and latency setting.

BRIEF SUMMARY OF THE INVENTION

The present invention addresses the problem of latency settings made during initialization which subsequently become unreliable due to system timing changes as the circuitry warms up. Most generally, the method of setting write latency comprises establishing an acceptable region within the preamble of a clock signal (DCLK) wherein the edges of the acceptable region are distinct from the edges of the preamble, and determining whether a write enable (RxEn) signal transitions within the acceptable region. Most preferably, the edges of the acceptable region are sufficiently spaced from the edges of the preamble so that any latency setting which causes the write enable (RxEn) signal to transition within the acceptable region during initialization will still cause the write enable (RxEn) signal to transition within the preamble after the system has reached its most extreme timing variations.

In one embodiment of the present invention, the acceptable region within the preamble is established by creating unacceptable regions within the preamble near each of the edges of the preamble. A first unacceptable or margin region established near the first edge of the preamble is established by delaying the clock signal (DCLK). In this way, the timing difference between the undelayed clock signal and the delayed clock signal becomes a first unacceptable region. A second unacceptable or margin region established near the second edge of the preamble is established by delaying the write enable (RxEn) signal. In this way, the timing difference between the undelayed write enable (RxEn) signal and the delayed write enable (RxEn) signal becomes a second unacceptable region. Most preferably the signal delays are accomplished using variable delay elements.

In another embodiment of the present invention, a reset signal is used to reset the system prior to the preamble of the clock signal (DCLK). In a specific embodiment, the reset signal is a write command signal which pulses low.

In yet another embodiment of the present invention, in addition to setting the acceptable region within the preamble of the clock signal, the present invention includes determining or indicating whether the write enable (RxEn) signal transitions within the acceptable region of the preamble for the present latency setting. In one embodiment, a detector enables associated comparators upon locating a leading edge of the preamble by identifying the first high to low transition of the clock signal (DCLK) following a circuit reset signal. A first, enabled comparator determines whether a transition from the first or leading edge of a delayed clock signal (DCLK) occurs prior to a transition in a write enable (RxEn) signal. A second, enabled comparator determines whether a transition from a delayed write enable (RxEn) signal occurs prior to a transition from the second or following edge of an undelayed clock signal (DCLK). An evaluator then evaluates the output from each comparator to determine if the latency setting being tested acceptably causes the write enable (RxEn) signal to transition within the preamble of the clock signal (DCLK). The evaluator then indicates if the latency setting is acceptable or unacceptable.

In a further embodiment, in addition to setting the acceptable region within the preamble of the clock signal, a first arbiter determines whether a delayed clock signal (DCLK) transitions prior to the write enable (RxEn) signal transition, in which case the write enable (RxEn) signal transition was not prior to or within the margin region nearest the first or leading edge of the preamble. A second arbiter then determines whether a delayed write enable (RxEn) signal transitioned prior to the second or following edge of the preamble, in which case the write enable (RxEn) signal transition was not after or within the margin region nearest the second edge of the preamble. If the write enable (RxEn) signal is prior to or within the margin region nearest the first edge of the preamble, or after or within the margin region nearest the second edge of the preamble, the latency setting being tested is unacceptable. In such an instance, the latency setting is changed and the process begins again to test the new latency setting. Contrarily, if the write enable (RxEn) signal transitions between the margin regions, the latency setting being tested is acceptable and a signal indicating the acceptability is produced. Optionally, the indication of acceptability may be stored in a memory register for reading by the memory controller.

The present invention also includes a circuit for use with the method described herein. The circuit comprises delay circuits to delay the necessary signals, and arbiters, or temporal comparators to determine the priority and timing of signals to indicate whether the latency settings used acceptably allowed the write enable (RxEn) signal to transition within the preamble, yet sufficiently separated from the edges of the preamble to avoid shifting outside the preamble after initialization.

BRIEF DESCRIPTION OF THE SEVERAL VIEWS OF THE DRAWINGS

The nature of the present invention as well as other embodiments of the present invention may be more clearly understood by reference to the following detailed description of the invention, to the appended claims, and to several drawings herein, wherein:

DETAILED DESCRIPTION OF THE INVENTION

Figure 1:
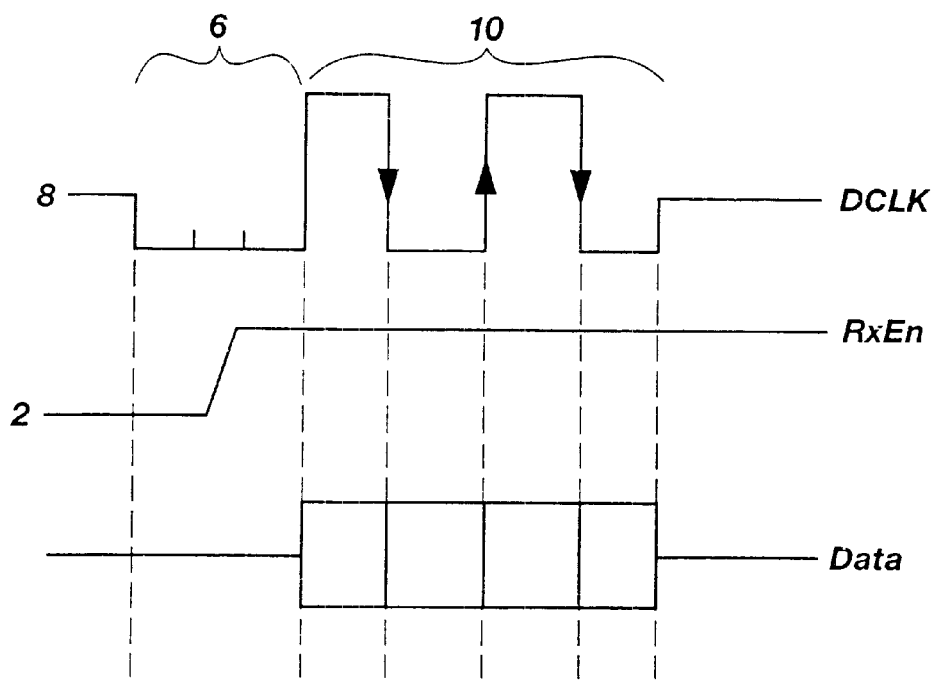
FIG. 1 is a timing diagram of a prior art DRAM memory write enable process comparing the DCLK, write enable (RxEn) and Data signals.
Figure 2:
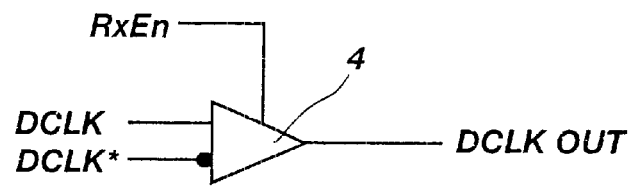
FIG. 2 is a diagram of a prior art DRAM receiver.
Figure 3:
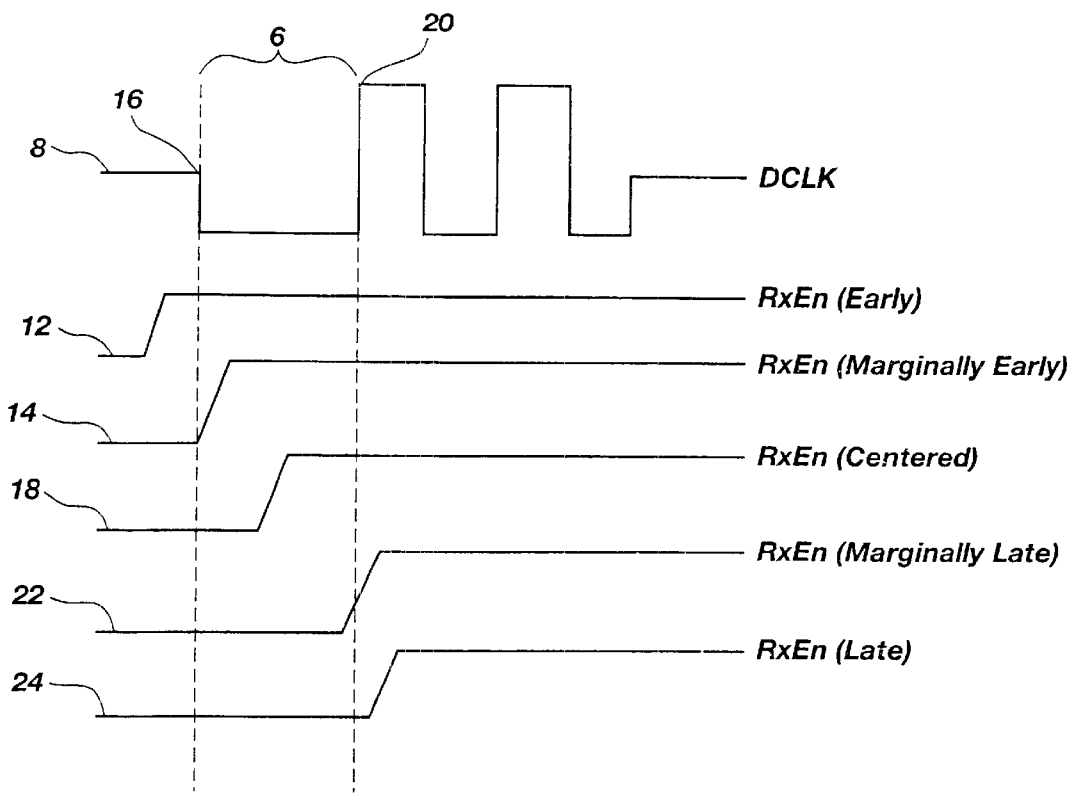
FIG. 3 is a timing diagram comparing several write enable (RxEn) signal timings with the DCLK signal of DRAM memory.

FIG. 3 illustrates five general timing categories of write enable (RxEn) signals with respect to a DCLK signal 8. The RxEn (Early) signal 12 is a signal which transitions before the preamble 6 of the DCLK signal 8. The RxEn (Marginally Early) signal 14 is a signal which transitions within the preamble 6, but near the start 16 of the preamble 6. The RxEn (Centered) signal 18 is a signal which transitions within the preamble 6, but not near either the start 16 or the end 20 of the preamble 6. The RxEn (Marginally Late) signal 22 is a signal which transitions within the preamble 6, but near the end 20 of the preamble 6. The RxEn (Late) signal 24 is a signal which transitions after the preamble 6 of the DCLK signal 8. As briefly described above, one problem that occurs using prior art write latency settings is that as the system warms up, signal timing may shift, resulting in problems with the initial latency settings. The presently acceptable range of latency settings include settings where the write enable (RxEn) signal transitions near the start 16 or end 20 of the preamble 6. If the latency setting established during initialization is one where the write enable (RxEn) signal transitions near the start 16 or end 20 of the preamble 6, such as RxEn (Marginally Early) 14 or RxEn (Marginally Late) 22, when the system warms up, the write enable (RxEn) signal may shift far enough so as to not transition within the preamble 6.

Figure 4:
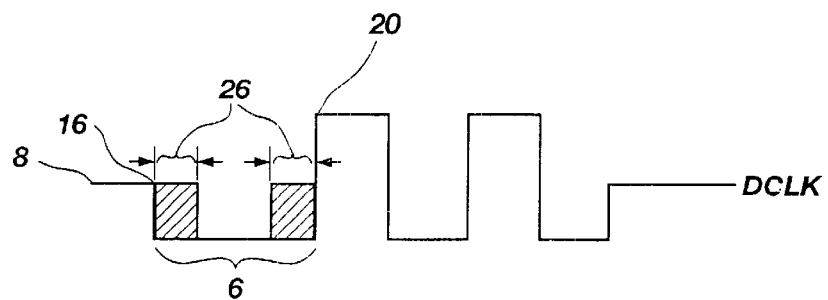
FIG. 4 is a timing diagram of a DRAM memory write enable process depicting the margin regions of a DCLK preamble.

FIG. 4 depicts a timing diagram of a DRAM write enable process of the present invention wherein time margin regions 26 near the start 16 and end 20 of the preamble 6 of the DCLK signal 8 are preselected for a system as being an unacceptable range within the preamble 6 for the write enable (RxEn) signal to transition. Not only does the write enable (RxEn) signal need to transition within the preamble 6 to be acceptable for the preferred embodiments of the present invention, but it is preferable that it not transition within either of the time margin regions 26. As will be clear from the following disclosure, however, the time margin regions 26 may be adjusted to as large or as small as needed for a specific application so long as the time margin regions 26 themselves do not overlap. In this way, the process adapts for the postinitialization changes in a system by selecting a latency setting which allows for a buffer zone in which the write enable (RxEn) signal may shift with respect to the DCLK preamble boundaries without shifting outside of the preamble 6.

Figure 5:
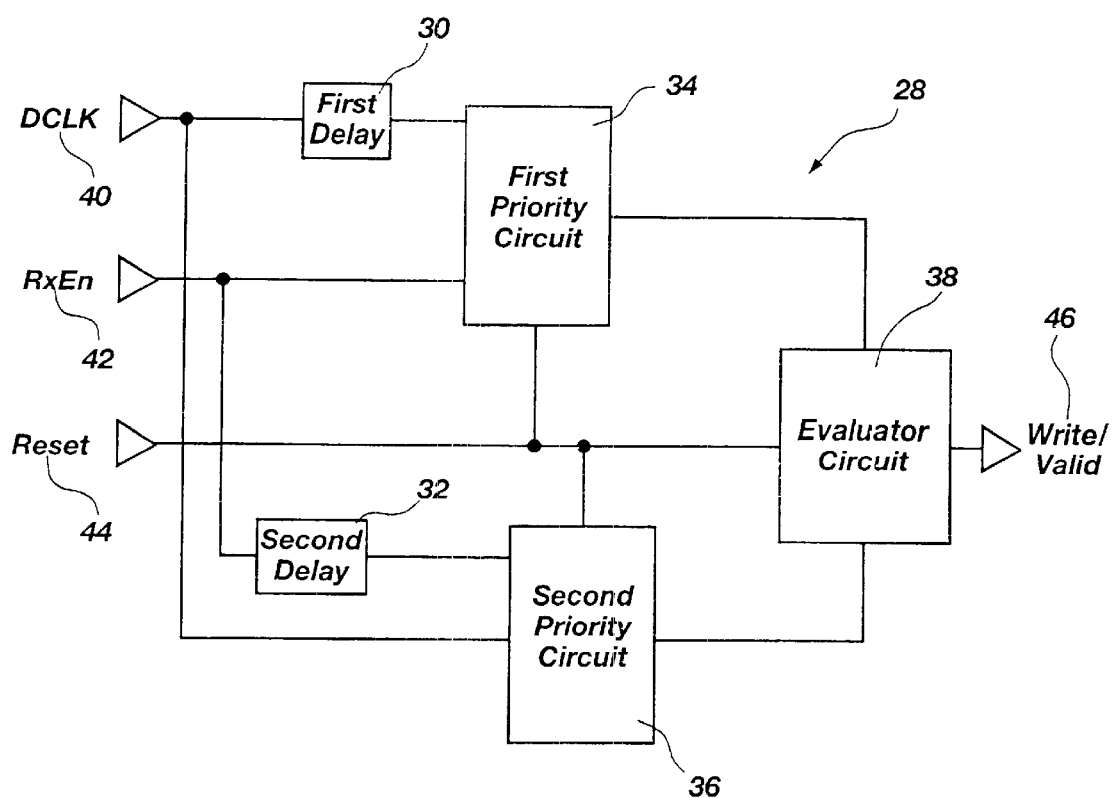
FIG. 5 is a block diagram of a write/valid indicator circuit for use in setting latency in a preferred embodiment of the present invention.
Figure 6:
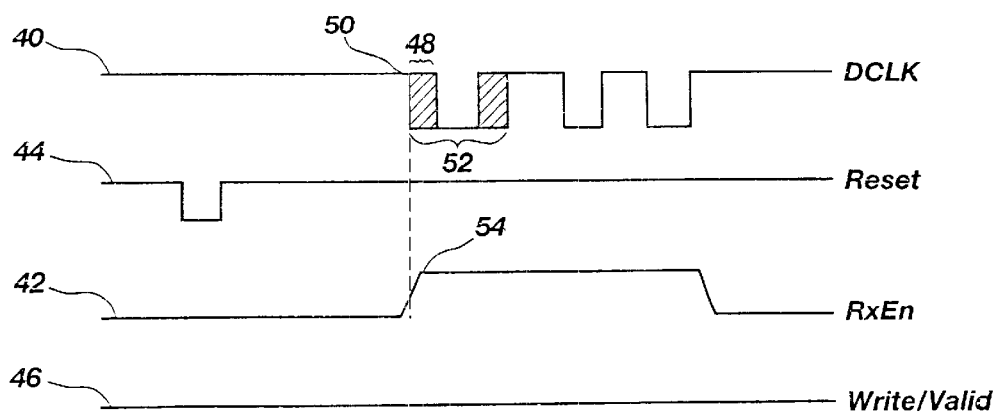
FIG. 6 is a timing diagram of a DRAM memory write enable process depicting marginally early timing for an embodiment of the present invention.

FIG. 5 is a block diagram of a write/valid indicator circuit 28 for use in setting latency in an embodiment of the present invention comprising first delay 30, second delay 32, first priority circuit 34, second priority circuit 36 and evaluator circuit 38. According to the present embodiment, the first delay 30 delays a clock signal (DCLK) 40 (also referred to as "DCLK signal 40") by a predetermined time $T_1$. The first priority circuit 34 then receives both the delayed DCLK signal 40 and an undelayed write enable (RxEn) signal 42 and compares the signals to determine whether the leading edge 50 (FIG. 6) of the preamble 52 of delayed DCLK signal 40 transitioned low prior to the undelayed RxEn signal 42 transitioning high. If the delayed DCLK signal 40 transitioned low before the undelayed RxEn signal 42 transitioned high, the first priority circuit 34 indicates this with a signal to the evaluator circuit 38. By comparing a RxEn signal 42 with the DCLK signal 40 delayed by time $T_1$, and indicating when the delayed DCLK signal 40 transitions low first, the first priority circuit 34 ensures that undelayed RxEn signal 42 has transitioned at least time $T_1$ away from the leading edge 50 of the preamble 52 (FIG. 6). In this way, as depicted in FIG. 6, write/valid indicator circuit 28 sets a first time margin region 48 near the leading edge 50 of the DCLK signal 40 preamble 52. In other words, if the RxEn signal 42 transitions high 54 within the first time margin region 48 or prior to the preamble 52, the first priority circuit 34 (FIG. 5) will indicate the RxEn signal 42 as transitioning high 54 within an unacceptable portion of the preamble 52 and will, therefore, indicate the present latency setting is unacceptable.

Figure 7:
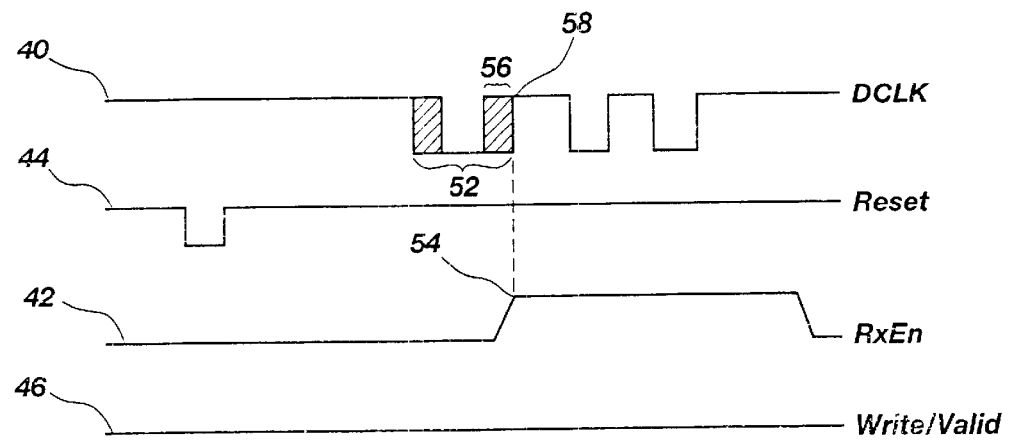
FIG. 7 is a timing diagram of a DRAM memory write enable process depicting marginally late timing for an embodiment of the present invention.

Also according to this first preferred embodiment shown in FIG. 5, the second delay 32 delays a RxEn signal 42 by a predetermined time $T_2$. The second priority circuit 36 then receives both the delayed RxEn signal 42 and an undelayed clock signal (DCLK) 40 and compares the signals to determine whether the delayed RxEn signal 42 transitioned high prior to the following edge 58 (FIG. 7) of the undelayed DCLK signal 40 transitioning high. If the delayed RxEn signal 42 transitioned high before the undelayed DCLK signal 40 transitioned high, the second priority circuit 36 indicates this with a signal to the evaluator circuit 38. By comparing a RxEn signal 42 delayed by time $T_2$ with a DCLK signal 40 and indicating when the delayed RxEn signal 42 transitions high first, the second priority circuit 36 ensures that the undelayed RxEn signal 42 has transitioned at least time $T_2$ away from the following edge 58 of the preamble 52 (FIG. 7). In this way, as depicted in FIG. 7, write/valid indicator circuit 28 (not shown) sets a second time margin region 56 near the following edge 58 of the DCLK signal 40 preamble 52. In other words, if the RxEn signal 42 transitions high 54 within the second time margin region 56 or after the preamble 52, the second priority circuit 36 (FIG. 5) will indicate the RxEn signal 42 as transitioning high 54 within an unacceptable portion of the preamble 52 and will, therefore, indicate the present latency setting is unacceptable.

Figure 8:
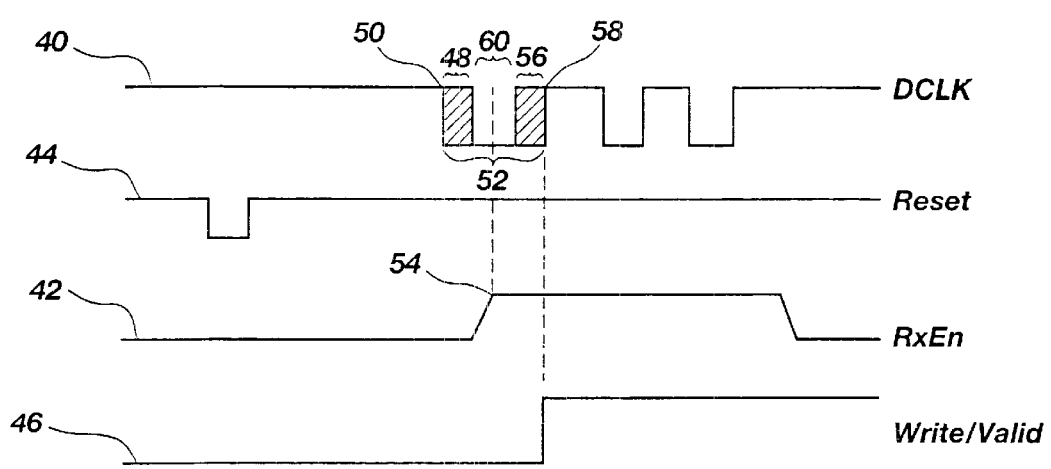
FIG. 8 is a timing diagram of a DRAM memory write enable process depicting good timing for an embodiment of the present invention.

The evaluator circuit 38 of the write/valid indicator circuit 28 of FIG. 5 evaluates whether the indications from the first priority circuit 34 and the second priority circuit 36 indicate an acceptable latency setting. If the latency setting is acceptable, as shown in FIG. 8, the evaluator circuit 38 (not shown) outputs a valid write/valid signal 46 indicating that the present latency setting being tested is acceptable in that the RxEn signal 42 transitioned high 54 within an acceptable region 60 of the preamble 52. In other words, evaluator circuit 38 outputs a valid write/valid signal 46 when the RxEn signal 42 transitions high 54 after the leading edge 50 of the preamble 52 but not within the first time margin region 48, and before the following edge 58 of the preamble 52 but not within the second time margin region 56.

In another embodiment of the present invention, as further shown in FIG. 5, a reset signal communicates a reset signal 44 to either the first priority circuit 34, the second priority circuit 36, or the evaluator circuit 38, or all three circuits, to reset internal circuitry depending on the components used. Additionally, any of the three circuits may use one or both of the DCLK signal 40 and the RxEn signal 42 to accomplish the method of this invention. In yet another embodiment, the evaluator circuit 38 compares the order of arrival of signals from the first priority circuit 34 and the second priority circuit 36 in relation to each other and the reset signal 44 to evaluate whether the RxEn signal 42 transitioned acceptably.

As will be clear to one of skill in the art, circuits such as the first and second delay circuits which take a signal and delay it by a predetermined time T are well-known. Furthermore, it is believed that the design of comparator, arbiter and evaluator circuits which will accomplish the methods of this invention will be known to one of ordinary skill in the art given the disclosure herein.

As shown in FIG. 6, if the RxEn signal 42 transitions high within the first time margin region 48 of the DCLK signal 40, valid write/valid signal 46 will not transition to high, indicating the latency setting was not acceptable. Similarly, as shown in FIG. 7, if the RxEn signal 42 transitions high within the second time margin region 56 of the DCLK signal 40, valid write/valid signal 46 will not transition to high, indicating again that the latency setting was not acceptable. Contrarily, FIG. 8 depicts a timing diagram of a DRAM write enable process showing good timing wherein the valid write/valid signal 46 transitions high after the RxEn signal 42 transitions high within the preamble 52 acceptable region 60, between the two time margin regions 48 and 56.

Figure 9:
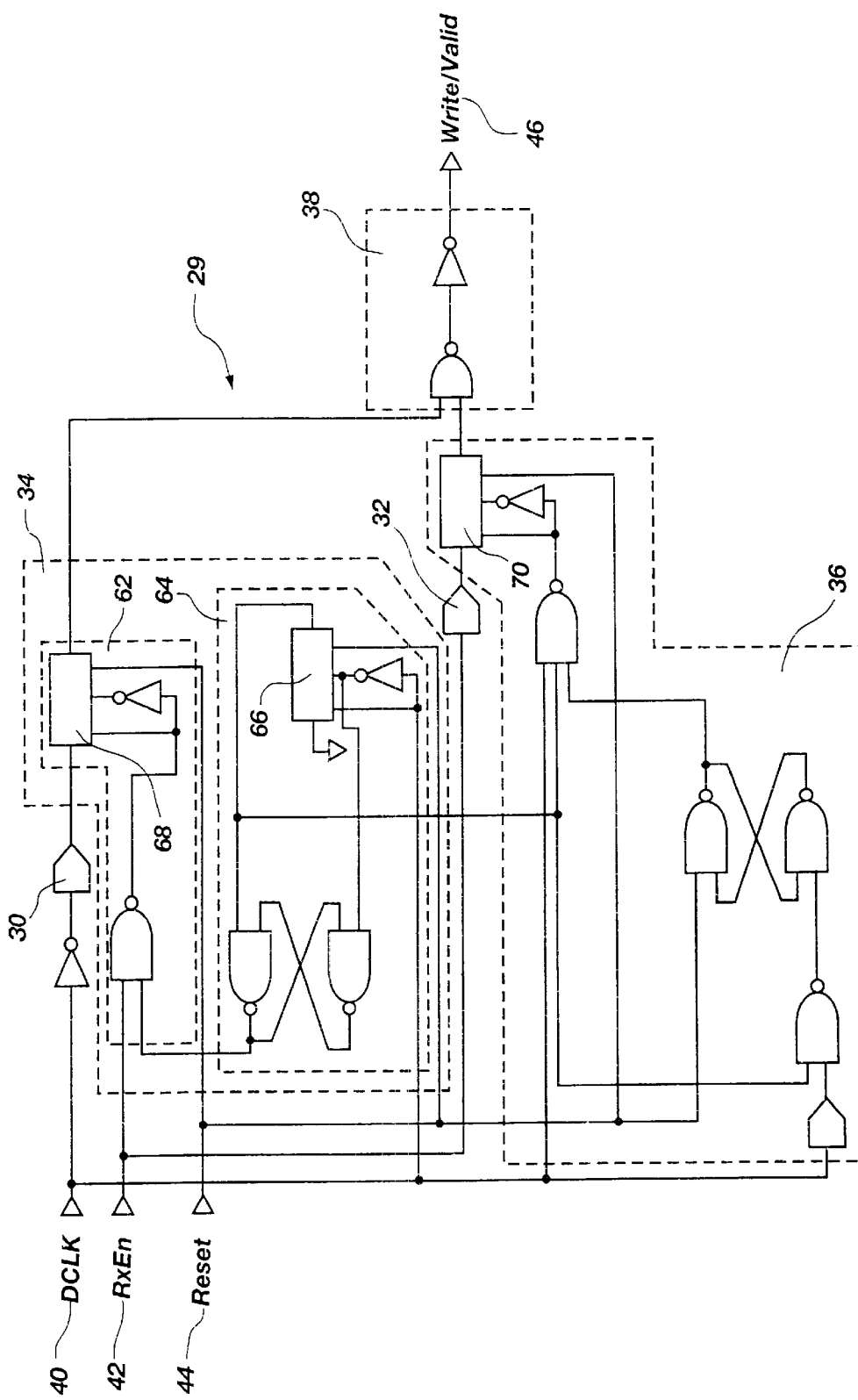
FIG. 9 is a schematic diagram of a write/valid indicator circuit of a first specific preferred embodiment of the present invention.

FIG. 9 depicts a first specific preferred embodiment of the invention shown in FIG. 5. The specific elements shown in FIG. 5 are indicated in FIG. 9 by dashed-line-bounded regions and associated reference numbers. Other, more specific elements of FIG. 9 are included in the following description. Shown in FIG. 9 is a write/valid indicator circuit 29 comprising primarily three sub-circuits 34, 36 and 38, first delay 30 and second delay 32. The first priority circuit 34 comprises a temporal comparator portion 62 and a leading edge detector portion 64. The leading edge detector portion 64 locates the leading edge of the preamble by identifying the first high to low transition of the clock signal (DCLK) 40 following a circuit reset through reset signal 44. Reset signal 44 is preferably a write command signal. This action is accomplished with a latch 66 clocked by the DCLK signal 40. The input to this latch 66 is high, although the latch 66 is reset low by the reset signal 44. When the DCLK signal 40 transitions, the latch 66 output transitions high to enable the first and second priority circuits 34 and 36. The temporal comparator portion 62 of the first priority 34 uses a register 68 to determine whether a transition of the RxEn signal 42 or a transition of the delayed DCLK signal 40 occurs first. The amount of the delay for the DCLK signal 40 is determined by delay 30. If the delayed DCLK signal 40 transitions from high to low after the RxEn signal 42 transitions from low to high, the input to register 68 will be low when the RxEn signal 42 transitions to high at register 68. The register 68 output will therefore be low, indicating the RxEn signal 42 was early. If the delayed DCLK signal 40 transitions before the RxEn signal 42 transitions, the input to register 68 will be high when the RxEn signal 42 transitions at the register 68. The register 68 output will, therefore, be high, indicating the RxEn signal 42 was acceptably separated from the leading edge 50 of the DCLK signal 40.

The second priority circuit 36 of the write/valid indicator circuit 29 is also a temporal comparator circuit which works complementarily to the first temporal comparator portion 62. Using a register 70, the second priority circuit 36 temporal comparator determines whether a delayed RxEn signal 42 or the following or rising edge of the preamble 52 of the clock signal (DCLK) 40 occurs first. The amount of delay for the RxEn signal 42 is determined, again, by a second delay 32. If the delayed RxEn signal 42 transitions from low to high before the transition of the DCLK signal 40 from low to high, then the input to the register 70 will be high when the rising edge of the DCLK signal 40 reaches the register 70. This register 70 will, therefore, output a high signal indicating that the RxEn signal 42 preceded the rising edge of the DCLK signal 40 preamble 52 with an acceptable margin. If the delayed RxEn signal 42 transitions from low to high after the rising edge of the DCLK signal 40 preamble 52, then the input to the register 70 will be low when the transition of the delayed RxEn signal 42 reaches the register 70. The register 70 will, therefore, remain low, indicating the RxEn signal 42 was late.

The third evaluator circuit 38 of the write/valid indicator circuit 29 is an evaluator circuit which determines the write timing to be valid only if the outputs from both the first temporal comparator portion 62 register 68 and the second priority circuit 36 temporal comparator register 70 are high. If either is low, then the write timing is unacceptable.

Figure 10:
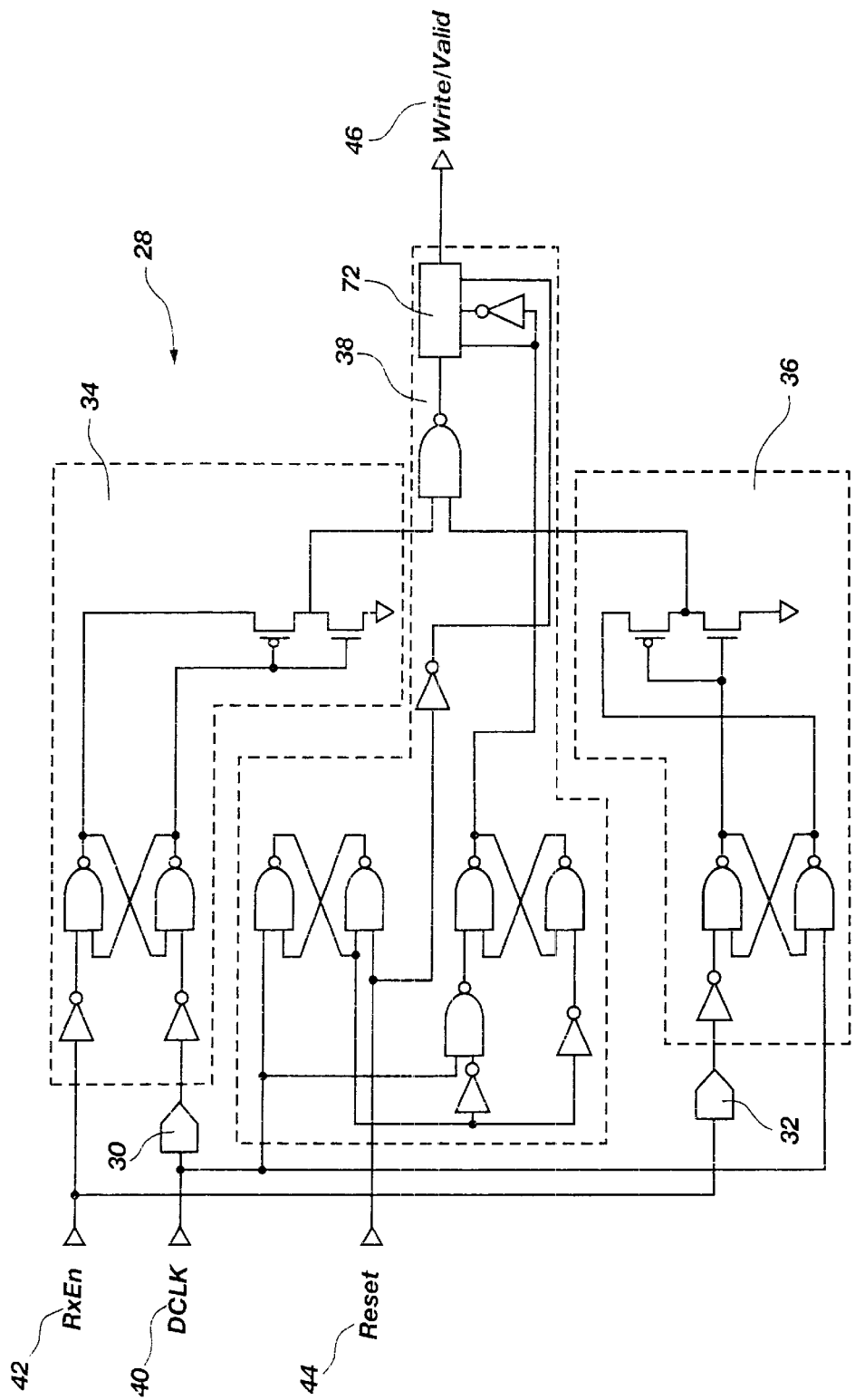
FIG. 10 is a schematic diagram of a write/valid indicator circuit of an embodiment of the present invention.

A second specific preferred embodiment of a write/valid indicator circuit 28 of the present invention, illustrated in schematic form in FIG. 10, uses a first priority circuit 34 also referred to herein as arbiter 34 to indicate to evaluator circuit 38 whether a transition from high to low in the leading edge of a preamble of a clock signal (DCLK) 40 which has been delayed by time $T_1$ arrives at the arbiter 34 prior to a transition from low to high in a RxEn signal 42. The amount of delay in the DCLK signal 40, and consequently the size of the first time margin region, is determined by first delay 30. A second priority circuit 36 also referred to herein as arbiter 36 indicates to evaluator circuit 38 whether a transition from low to high in the following edge of a preamble of a clock signal (DCLK) 40 arrives at the arbiter 34 prior to a transition from low to high in a RxEn signal 42 which has been delayed by time $T_2$. The amount of delay in the RxEn signal 42, and consequently the size of the second time margin region, is determined by second delay 32. The evaluator circuit 38 for this second specific preferred embodiment evaluates the indications of arbiters 34 and 36 to determine whether both are high and whether the leading edge of the preamble of the clock signal (DCLK) 40 came after the low pulse of the reset signal 44. If the RxEn signal 42 appropriately arrived within the acceptable region within the preamble, a register 72 within the evaluator circuit 38 will output a high signal to indicate an acceptable latency setting.

Referring to FIGS. 6, 7 and 8, the output of the circuit illustrated in FIG. 10, like the circuit of FIGS. 5 and 9, is a valid write/valid signal 46 only when a rising DCLK signal 40 is detected after a rising RxEn signal 42 at at least time $T_2$ before the rising DCLK signal 40 is detected, and a falling DCLK signal 40 is detected at at least time $T_1$ before the rising RxEn signal 42 is detected. The circuit is reset when the DRAM receives a write command by the reset signal 44 which pulses low.

Other circuit configurations, circuit elements and methods of operation which may be used to implement the invention will be apparent to one of ordinary skill in the art from the disclosure herein. For example, an acceptable region 60 within the preamble 52 of the clock signal (DCLK) 40 can be set by delaying the DCLK signal 40 twice and using the distance between the leading edges of the first delayed DCLK signal and the second delayed DCLK signal as an acceptable region. Though this is not presently a preferred embodiment, it may also accomplish a purpose of the invention. One of ordinary skill in the art will understand how to adapt specific preferred embodiments to a specific application or chip architecture as well as varying needs depending on the application and specific system characteristics. For any embodiment of the present invention, the valid write/valid signal 46 can be written to a register and then read out by the memory controller to determine if the write latency tested is correct.

It will be understood by one of ordinary skill in the art that for each test of a latency setting using the circuits illustrated in either of FIG. 9 or 10, a reset command must be received by the circuit to reset the registers prior to receiving the DCLK preamble. In a preferred embodiment of the present invention, the reset command is a write command such that the circuitry is reset for each write command received. It will also be understood by one of ordinary skill in the art that times $T_1$ and $T_2$ are arbitrary and can be set to any value, whether the same value or not, by altering the delay circuit used depending upon the system in which the write/valid indicator circuits 28,29 will be used. For example, in a standard computer application where the write enable (RxEn) signal can vary up to a full clock tick in either direction, it is preferable to use a three-tick preamble with both $T_1$ and $T_2$ set to a full tick each. Depending on the clock speed, etc., the duration of a clock tick will vary, but can readily be determined by one of ordinary skill in the art. In this way, even if the write enable (RxEn) signal does vary a full tick, the latency setting chosen at initialization will still be acceptable after the system warms up because the latency setting chosen ensured that the write enable (RxEn) signal was sufficiently spaced from the starting and ending edges of the DCLK preamble to compensate for variations in relative timing due to the circuitry warming up or other variations.

Figure 11:
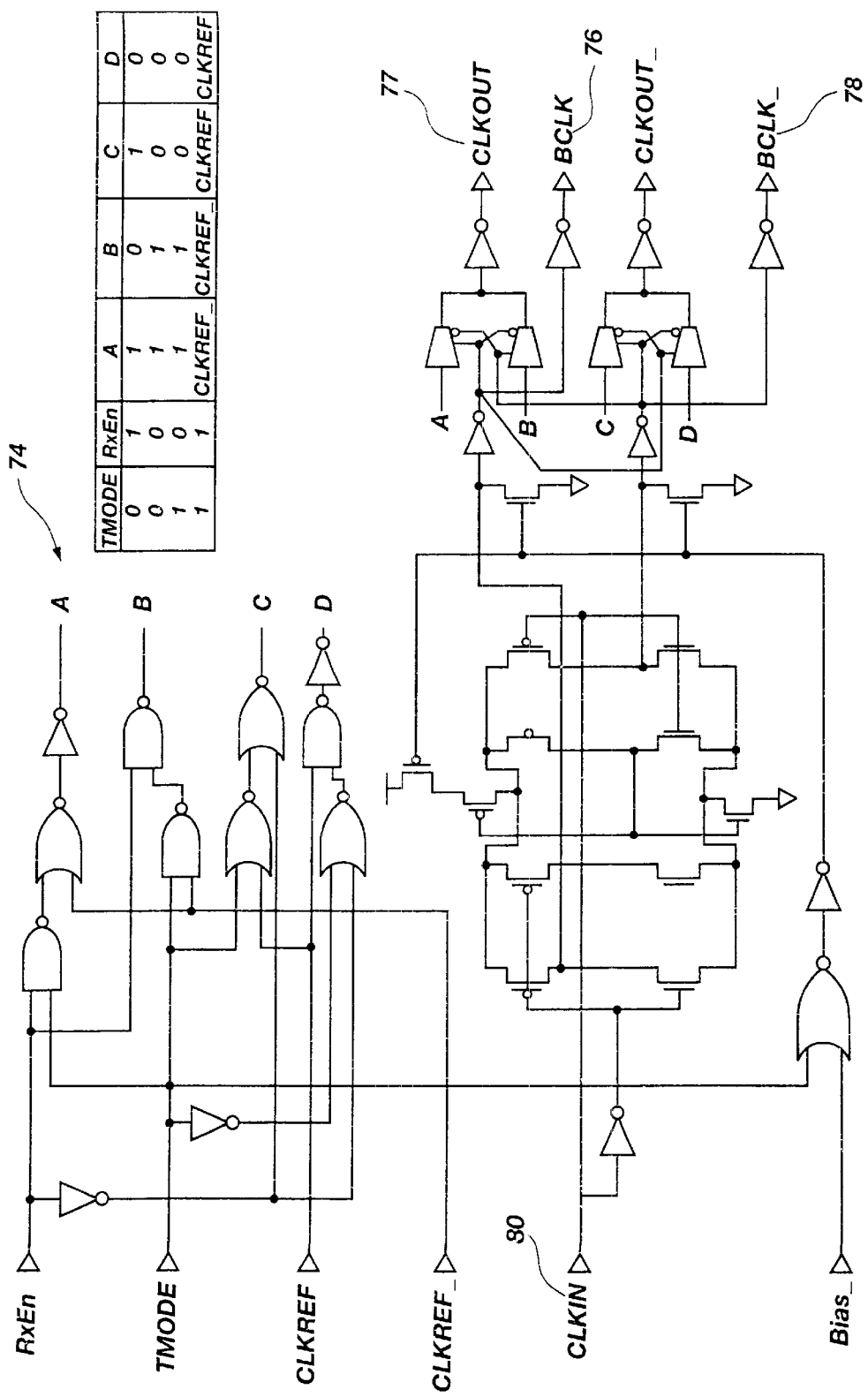
FIG. 11 is a schematic diagram of a clock receiver circuit for use with a write/valid indicator circuit of the present invention.

FIG. 11 is a schematic of a clock receiver circuit 74 for use with the present invention. The clock receiver circuit 74 of the present invention, unlike typical clock receiver circuits, comprises buffered clock signal outputs (BCLK and BCLK_) 76 and 78 which feed a clock signal to the write/valid indicator circuit 28. In the present embodiment of the clock receiver circuit 74, the CLKIN signal 80 must be driven to a logic high value prior to a preamble rather than operating at the typical supply voltage (VTERM) to ensure the clock receiver circuit 74 can detect both the leading and falling edges of the preamble. In the prior art, a typical supply voltage level (VTERM) was used because in using the prior art methods for setting latency, it was not necessary to see both the leading and falling edges of the preamble. By providing these additional buffered clock signal outputs (BCLK and BCLK_) 76 and 78, the write/valid indicator circuit 28 can monitor the clock signal separate from the write enable (RxEn) signal and, thus, more effectively establish an acceptable latency setting. The CLKOUT signal 77 is used as the internal DCLK signal 40 for the circuits in both FIGS. 9 and 10.

Figure 12:
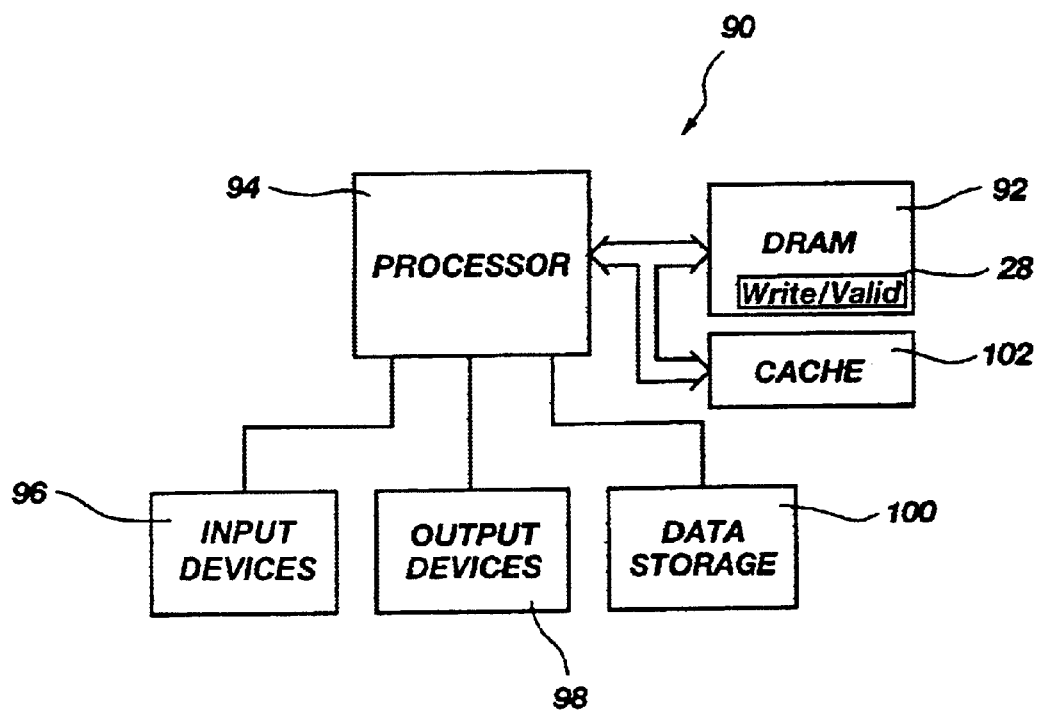
FIG. 12 is a block diagram of a computer system including DRAM according to the present invention.

FIG. 12 is a block diagram of an electronic system 90 which includes DRAM 92 comprising the write/valid indicator circuits 28, 29 as shown in FIG. 5. Either of the specific preferred embodiments as shown in FIGS. 9 and 10, or many other specific embodiments not shown herein but which accomplish similar designs, may also be used. The electronic system 90 includes a processor 94 for performing various computing functions, such as executing specific software to perform specific calculations or tasks. Additionally, the electronic system 90 includes one or more input devices 96, such as a keyboard or a mouse, coupled to the processor 94 to allow an operator to interface with the electronic system 90. Typically, the electronic system 90 also includes one or more output devices 98 coupled to the processor 94, such output devices typically being a printer, a video terminal or a network connection. One or more data storage devices 100 are also typically coupled to the processor 94 to store data or retrieve data from external storage media (not shown). Examples of typical data storage devices 100 include hard and floppy disks, tape cassettes, and compact discs. The processor 94 is also typically coupled to a cache memory 102, which is usually static random access memory ("SRAM"), and to the DRAM 92. It will be understood, however, that the write/valid indicator circuit 28 may also be incorporated into any one of the input, output and processor devices 96, 98 and 94.

Figure 13:
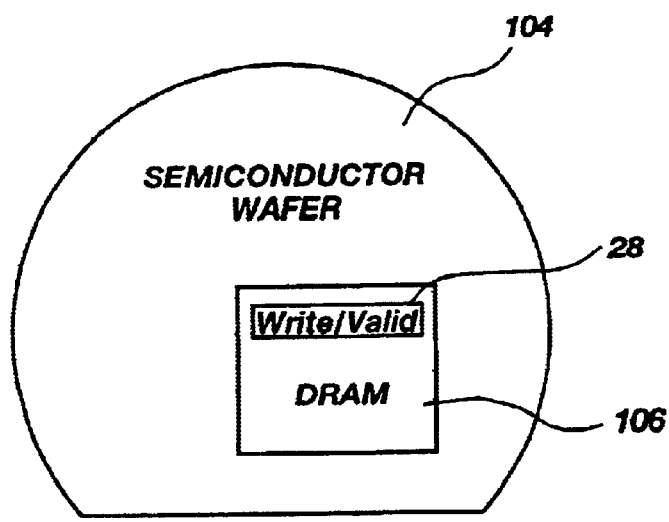
FIG. 13 is a block diagram of a semiconductor wafer including DRAM thereon according to the present invention.

As shown in FIG. 13, the write/valid indicator circuits 28, 29 of FIG. 5 and FIG. 9, respectively, is fabricated on the surface of a semiconductor wafer 104 of silicon, gallium arsenide, or indium phosphide in accordance with this invention as part of a DRAM 106. It will be understood that, alternatively, the specific preferred embodiments of write/valid indicator circuits 28, 29 shown in either of FIG. 9 or 10 may also be fabricated, and that one of skill in the art would know how to adapt such designs for a specific chip architecture or semiconductor fabrication process. Of course, it should be understood that the write/valid indicator circuits 28, 29 may be fabricated on semiconductor substrates other than a wafer, such as a Silicon-on-Insulator (SOI) substrate, a Silicon-on-Glass (SOG) substrate, a Silicon-on-Sapphire (SOS) substrate, or other semiconductor material layers on supporting substrates.

Although the present invention has been shown and described with reference to particular preferred embodiments, various additions, deletions and modifications that are obvious to a person skilled in the art to which the invention pertains, even if not shown or specifically described herein, are deemed to lie within the scope of the invention as encompassed by the following claims.

What is claimed is:

1. An electronic system comprising:
   a processor;
   at least one of an input device, an output device and a storage device associated with the processor;
   a memory device coupled to the processor for storing data and instructions for use by the processor, the memory device comprising a write/valid indicator circuit comprising:
      a clock input to receive a clock signal;
      at least one command input to receive at least one command signal;
      at least one signal delay circuit coupled to receive at least one of the clock signal and the at least one command signal, wherein the at least one signal delay circuit comprises:
         a first signal delay circuit coupled to receive the clock signal; and
         a second signal delay circuit coupled to receive the at least one command signal; and
      at least one priority circuit coupled to the at least one signal delay circuit and coupled to receive at least one of the clock signal and the at least one command signal, the at least one priority circuit comprising an output and configured to produce a valid latency setting signal on the output if the output from the at least one signal delay circuit, the at least one command signal and the clock signal each transition in a predetermined order, the at least one priority circuit further comprising at least one register.

2. The electronic system of claim 1, wherein the at least one priority circuit further comprises:
   a first circuit coupled to at least the first signal delay circuit and the at least one command input, the first circuit configured to indicate a timing relationship between a transition in an output signal from the first signal delay circuit and a transition in the at least one command signal; and
   a second circuit coupled to at least the second signal delay circuit and the clock input, the second circuit configured to indicate a timing relationship between a transition in an output signal from the second signal delay circuit and the clock signal.

3. The electronic system of claim 2, wherein the at least one priority circuit further comprises a third circuit coupled to at least the first circuit and the second circuit and configured to indicate a timing relationship between a transition in an output signal from the first circuit and a transition in an output signal from the second circuit.

4. An electronic system comprising:
   a processor;
   at least one of an input device, an output device and a storage device associated with the processor;
   a memory device coupled to the processor for storing data and instructions for use by the processor, the memory device comprising a write/valid indicator circuit comprising:
      a clock input to receive a clock signal;
      at least one command input to receive at least one command signal;
      at least one signal delay circuit coupled to receive at least one of the clock signal and the at least one command signal; and
      an arbiter coupled to the at least one signal delay circuit and coupled to receive at least one of the clock signal and the at least one command signal, the arbiter comprising an output and configured to produce a valid latency setting signal on the output if the output from the at least one signal delay circuit, the at least one command signal and the clock signal each transition in a predetermined order, the arbiter further comprising at least one register.

5. An electronic system comprising:
   a processor;
   at least one of an input device, an output device and a storage device associated with the processor;
   a memory device coupled to the processor for storing data and instructions for use by the processor, the memory device comprising a write/valid indicator circuit comprising:
      a clock input to receive a clock signal;
      at least one command input to receive at least one command signal;
      at least one signal delay circuit coupled to receive at least one of the clock signal and the at least one command signal; and
      a comparator coupled to the at least one signal delay circuit and coupled to receive at least one of the clock signal and the at least one command signal, the comparator comprising an output and configured to produce a valid latency setting signal on the output if an output from the at least one signal delay circuit, the at least one command signal and the clock signal each transition in a predetermined order, the comparator further comprising at least one register.

6. A semiconductor substrate comprising a DRAM having a write/valid indicator circuit comprising:
   a clock input terminal;
   a write enable command input terminal;
   a first signal delay element coupled to the clock input terminal;
   a second signal delay element coupled to the write enable command input terminal;
   a first priority circuit coupled to at least the first signal delay element and to the clock input terminal;
   a second priority circuit coupled to at least the second signal delay element and the write enable command input terminal; and
   an evaluator circuit coupled to at least the first priority circuit and the second priority circuit.

7. The semiconductor substrate of claim 6 wherein the write/valid indicator circuit further comprises a reset command input terminal, wherein at least one of the first priority circuit, the second priority circuit and the evaluator circuit is coupled to the reset command input terminal.

8. The semiconductor substrate of claim 7 wherein each of the first priority circuit, the second priority circuit and the evaluator circuit is coupled to the reset command input terminal.

9. A semiconductor substrate comprising a DRAM having a write/valid indicator circuit comprising:
   a clock input to receive a clock signal;

at least one command input to receive at least one command signal;

at least one signal delay circuit coupled to receive at least one of the clock signal and the at least one command signal, wherein the at least one signal delay circuit comprises:
   a first signal delay circuit coupled to receive the clock signal; and
   a second signal delay circuit coupled to receive the at least one command signal; and at least one priority circuit coupled to the at least one signal delay circuit and coupled to receive at least one of the clock signal and the at least one command signal, the at least one priority circuit comprising an output and configured to produce a valid latency setting signal on the output if an output from the at least one signal delay circuit, the at least one command signal and the clock signal each transition in a predetermined order, the at least one priority circuit further comprising at least one register.

10. The semiconductor substrate of claim 9, wherein the at least one priority circuit further comprises:
   a first circuit coupled to at least the first signal delay circuit and the at least one command input, the first circuit configured to indicate a timing relationship between a transition in an output signal from the first signal delay circuit and a transition in the at least one command signal; and
   a second circuit coupled to at least the second signal delay circuit and the clock input, the second circuit configured to indicate a timing relationship between a transition in an output signal from the second signal delay circuit and the clock signal.

11. The semiconductor substrate of claim 10, wherein the at least one priority circuit further comprises a third circuit coupled to at least the first circuit and the second circuit and configured to indicate a timing relationship between a transition in an output signal from the first circuit and a transition in an output signal from the second circuit.

* * * * *